United States Patent [19]
Han

[11] Patent Number: 5,743,280
[45] Date of Patent: Apr. 28, 1998

[54] APPARATUS FOR CLEANSING SEMICONDUCTOR WAFER

[75] Inventor: Suk-Bin Han, Choongcheongbuk-Do, Rep. of Korea

[73] Assignee: LG Semicon Co., Ltd., Choongcheongbuk-do, Rep. of Korea

[21] Appl. No.: 769,072

[22] Filed: Dec. 18, 1996

[30] Foreign Application Priority Data

Dec. 19, 1995 [KR] Rep. of Korea ............... 51997/1995

[51] Int. Cl.$^6$ ........................................ B08B 3/04
[52] U.S. Cl. .................. 134/56 R; 134/155; 134/186; 134/105; 134/183; 134/902; 134/201
[58] Field of Search .................. 134/902, 201, 134/56 R, 155, 186, 111, 105, 182, 183

[56] References Cited

U.S. PATENT DOCUMENTS

| | | | |
|---|---|---|---|
| 4,384,899 | 5/1983 | Marchetti | 134/183 |
| 5,569,330 | 10/1996 | Schild et al. | 134/902 |

FOREIGN PATENT DOCUMENTS

| | | | |
|---|---|---|---|
| 61-42917 | 3/1986 | Japan | 134/902 |
| 64-57624 | 3/1989 | Japan | 134/902 |
| 5-62962 | 3/1993 | Japan | 134/902 |
| 6-196466 | 7/1994 | Japan | 134/902 |

*Primary Examiner*—Frankie L. Stinson
*Attorney, Agent, or Firm*—Morgan, Lewis and Bockius LLP

[57] ABSTRACT

An improved apparatus for cleansing a semiconductor wafer which is capable of separating an inner tub into an upper and lower portion, for thus adjustably forming the inner tub, so that it is possible to fold the upper portion of the inner tub when cleansing the wafer, for thus reducing the cleansing space, whereby it is possible to reduce the amount of the cleansing liquid and increasing the cleansing effect. The apparatus includes an outer tub having a supply tube for supplying a cleansing liquid and for discharging the cleansing liquid, a lower inner tub disposed inside the outer tub, an upper lower tub disposed above the lower inner tub, which upper lower tub is adjustable in cooperation with a first hinge member, a driving member disposed in cooperation with a second member for opening and closing the upper inner tub, a control member for controlling the driving member, a baffle plate for distributing the cleansing liquid supplied through a supply tube, and a pump disposed in the supply tube for supplying the cleansing liquid into the inner tub.

4 Claims, 4 Drawing Sheets

APPARATUS FOR CLEANSING SEMICONDUCTOR WAFER

BACKGROUND OF THE INVENTION

1. Field of the Invention

The present invention relates to an apparatus for cleansing a semiconductor wafer, and in particular to an improved apparatus for cleansing a semiconductor wafer which is capable of providing an adjustable inner tub, for thus reducing a cleansing space when cleansing the wafer and the amount of a cleansing liquid.

2. Description of the Conventional Art

As a high integration semiconductor device is made, fine particles on the surface of the wafer may cause a critical damage to the characteristic of the device.

Therefore, recently, the cleansing technique is considered to be the most important technique in the industry so as to effectively cleanse the fine particles on the surface of the wafer.

In the LSI technique, a semiconductor device of 2 μm is actually used in the industry. When fabricating such semiconductor devices, a cleansing technique for maintaining an ultra-environment is necessary in the fabrication process of the high integration semiconductor device.

Therefore, as the wafer is made larger, and the chip size is made smaller, a new cleansing apparatus has been developed. In particular, a technique for reducing the cleansing liquid (or a cleansing water) provided into the cleansing tub has been intensively studied.

FIG. 1 is a view illustrating the construction of a conventional semiconductor wafer cleansing apparatus, which is an over flow bath system.

As shown therein, there are provided an outer tub 1 having a cleansing liquid supply tube 1a and a discharge tube 1b arranged below the outer tub 1, an inner tub 2 arranged within the outer tub 2, a baffle plate 3 for supplying the cleansing liquid to a wafer "W" mounted on the bottom of the inner tub 2, and a pump 4 disposed in the supply tube 1a for supplying the cleansing liquid.

The operation of cleansing the wafer in the conventional semiconductor cleansing apparatus will now be explained with reference to the accompanying drawings.

First, the wafer "W" to be cleansed is mounted in the inner tub 2, and then the pump 4 is driven, and the cleansing liquid is supplied to the interior of the inner tub 2 through the supply tube 1a disposed below the outer tub 1, for thus cleansing the fine particles on the surface of the wafer "W".

Here, the amount and the flowing rate of the cleansing liquid supplied to the inner tub 2 are controlled by a plurality of distribution holes (not shown) formed in the baffle plate 3, for thus cleansing the wafer "W". When the cleansing liquid is filled in the inner tub 2, the cleansing liquid is over-flown to the outer tub 1, and the thusly over-flown cleansing liquid is supplied to the inner tub 2 by the motor 4. If the cleansing liquid is polluted, the polluted cleansing liquid is discharged to the outside through a predetermined path.

However, the conventional semiconductor wafer cleansing apparatus is directed to an over flow bath system which is intended for supplying to the inner tub 2 and over-flowing the cleansing liquid, so that the cleansing liquid must be supplied to the limit of the inner tub 2 beyond the top of the wafer "W". Therefore, it is impossible to reduce the amount of the cleansing liquid. In addition, it is impossible to control the flowing manner of the cleansing liquid with respect to various shapes of the wafer "W", for thus decreasing the cleansing effect of the wafer "W".

SUMMARY OF THE INVENTION

Accordingly, it is an object of the present invention to provide an apparatus for cleansing a semiconductor wafer which overcomes the problems encountered in the conventional art.

It is another object of the present invention to provide an improved apparatus for cleansing a semiconductor wafer which is capable of separating an inner tub into an upper and lower portion, for thus adjustably forming the inner tub, so that it is possible to fold the upper portion of the inner tub when cleansing the wafer, for thus reducing the cleansing space, whereby it is possible to reduce the amount of the cleansing liquid and increasing the cleansing effect.

To achieve the above objects, there is provided an apparatus for cleansing a semiconductor wafer which includes an outer tub having a supply tube for supplying a cleansing liquid and for discharging the cleansing liquid, a lower inner tub disposed inside the outer tub, an upper lower tub disposed above the lower inner tub, which upper lower tub is adjustable in cooperation with a first hinge member, a driving member disposed in cooperation with a second member for opening and closing the upper inner tub, a control member for controlling the driving member, a baffle plate for distributing the cleansing liquid supplied through a supply tube, and a pump disposed in the supply tube for supplying the cleansing liquid into the inner tub.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
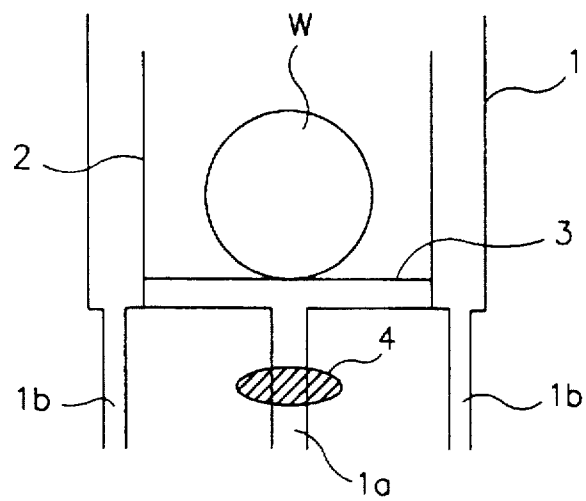
FIG. 1 is a view illustrating the construction of a conventional semiconductor wafer cleansing apparatus.
Figure 2:
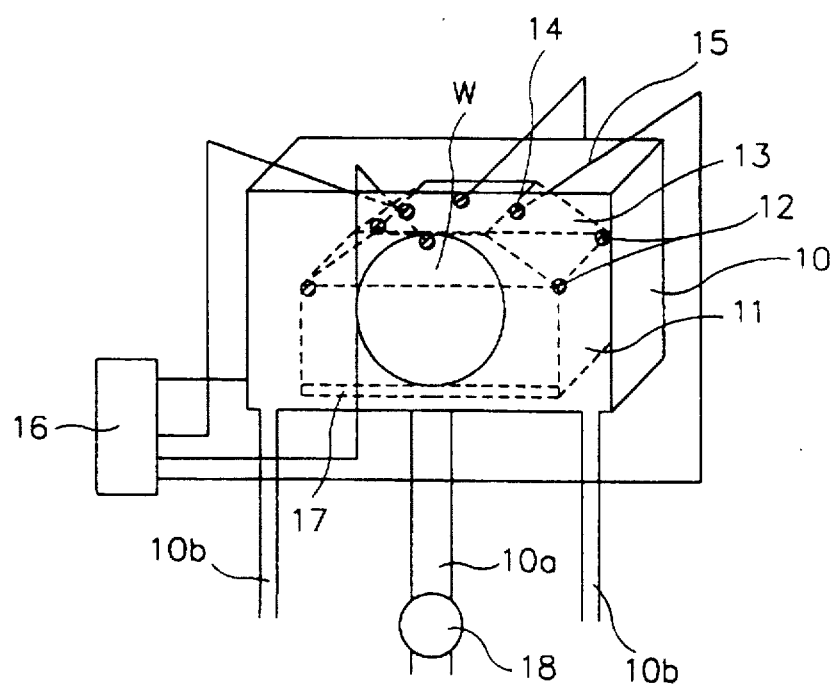
FIG. 2 is a perspective view illustrating the construction of a semiconductor wafer cleansing apparatus according to the present invention.

FIG. 2 is a perspective view illustrating the construction of a semiconductor wafer cleansing apparatus according to the present invention.

As shown therein, a lower inner tub 11 having a supply tube 10a for supplying a cleansing liquid and discharge tubes 10b for discharging the cleansing liquid is disposed in an outer tub 10, an upper end of which supply tube 10a is connected to the lower inner tub 11, and upper ends of which discharge tubs 10b are connected to the outer but. An upper inner tub 13 is adjustably formed above the lower inner tub 11 in cooperation with a first hinge member 12. A robot arm 15, which is a movable member, is disposed in the upper portion of the upper inner tub 13 in cooperation with a ring-shaped adjustable second hinge member 14.

In addition, a control member 16 is disposed in the robot arm 15 for controlling the movement of the robot arm 15. A baffle plate 17 is disposed in a bottom portion of the upper and lower inner tubs 13 and 11. A plurality of distribution holes (not shown) are formed in the baffle plate 17 for uniformly distributing the cleansing liquid, which is introduced through the supply tube 10a, to the wafer "W".

In addition, a pump 18 is disposed in the supply tube 10a for pumping the cleansing liquid into the interior of the upper and lower inner tubs 13 and 11. Here, the upper and lower inner tubs 13 and 11, the first hinge member 12, and the second hinge member 14 are made of a material which does not form foreign matters and has a good characteristic with respect to the cleansing liquid.

The operation for cleansing the wafer by using the semiconductor wafer cleansing apparatus according to the present invention will now be explained with reference to the accompanying drawings.

Figure 3A:
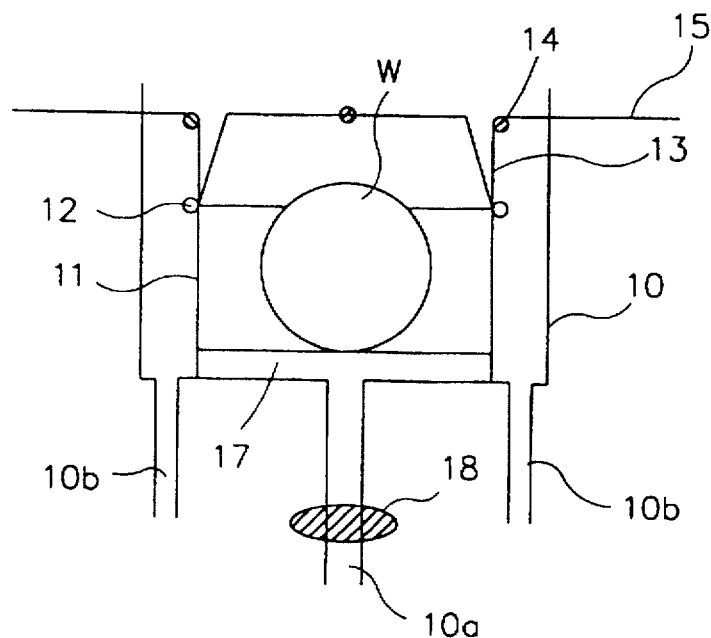
FIGS. 3A and 3B are respectively a cross-sectional view and a top view illustrating a state that a wafer is being mounted in a semiconductor wafer cleansing apparatus according to the present invention.
Figure 3B:
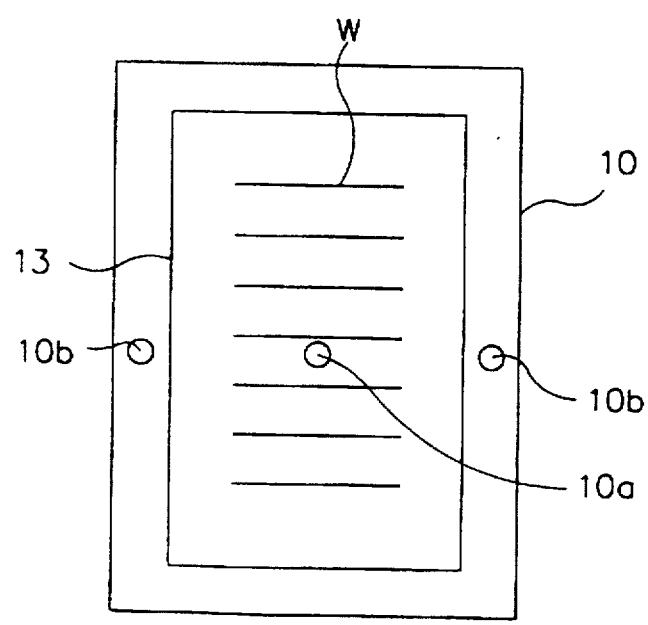

First, as shown in FIGS. 3A and 3B, the upper inner tub 13 is unfolded by the robot arm 15, and the both sides of the lower inner tub 11 and the both walls of the unfolded upper inner tub 13 are made vertical. The wafer "W" to be cleansed is moved into the interior of the upper and lower inner tubs 13 and 11 by using a wafer chuck (not shown).

Figure 4A:
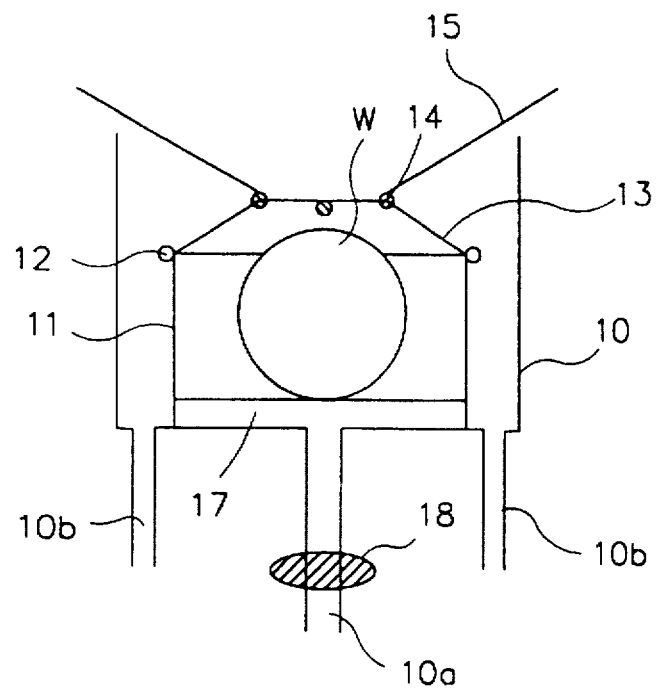
FIGS. 4A and 4B are respectively a cross-sectional view and a top view illustrating a state that a wafer is cleansed in a semiconductor wafer cleaning apparatus according to the present invention.
Figure 4B:
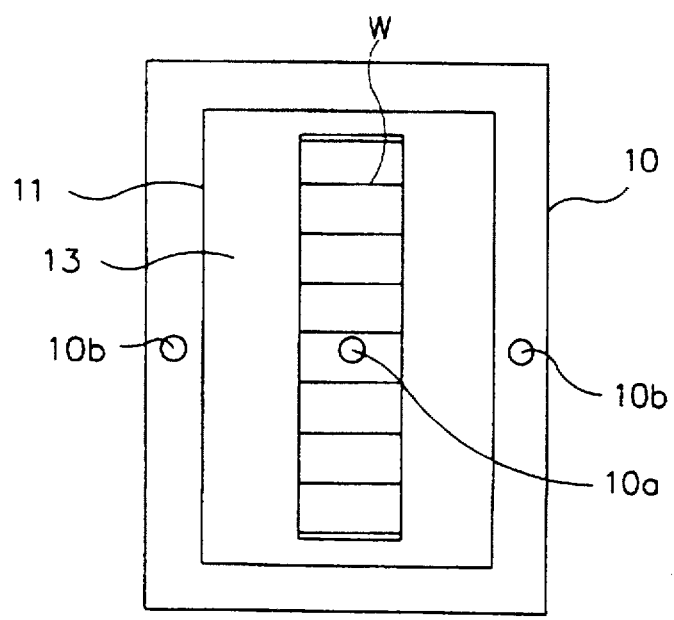

Next, as shown in FIGS. 4A and 4B, when the robot arm 15 disposed above the upper inner tub 13 is moved toward the inside of the upper and lower inner tubs 13 and 11, the first hinge member 12 and the second hinge member 14 become bent, and the upper inner tub 13 is inwardly folded. Here, neighboring corners of the upper inner tub 13 come into contact with each other. As a result, a cleansing space is defined between the inner surface of the upper inner tub 13 and the upper portion of the wafer "W", with a gap being formed therebetween more than 1 mm. In this state, when the pump 18 is driven, the cleansing liquid is supplied into the upper and lower inner tubs 13 and 11 through the supply tube 10a, for thus cleansing the wafer "W" therein.

When the cleansing liquid is continuously supplied thereinto, the cleansing liquid is over-flown along the outer circumferential surface of the wafer "W" in cooperation with the folded upper inner tub 13, and then is over-flown beyond the limit of the upper inner tub 13 to the outside through the discharge tube 10b. In addition, the discharged cleansing liquid is circulated along the above-described flowing paths by the pump 18. After a predetermined number of the circulations, the polluted cleansing liquid is discharged to the outside of the system.

In addition, when the wafer cleansing process is completed after a predetermined number of cleansing processes, as shown in FIG. 3A, the robot arm 15 is outwardly and backwardly moved, and both walls of the upper inner tub 13 and both sides of the lower inner tub 11 are made vertical, and then the wafer "W" is taken out by using the wafer chuck for the next processing.

Figure 5:
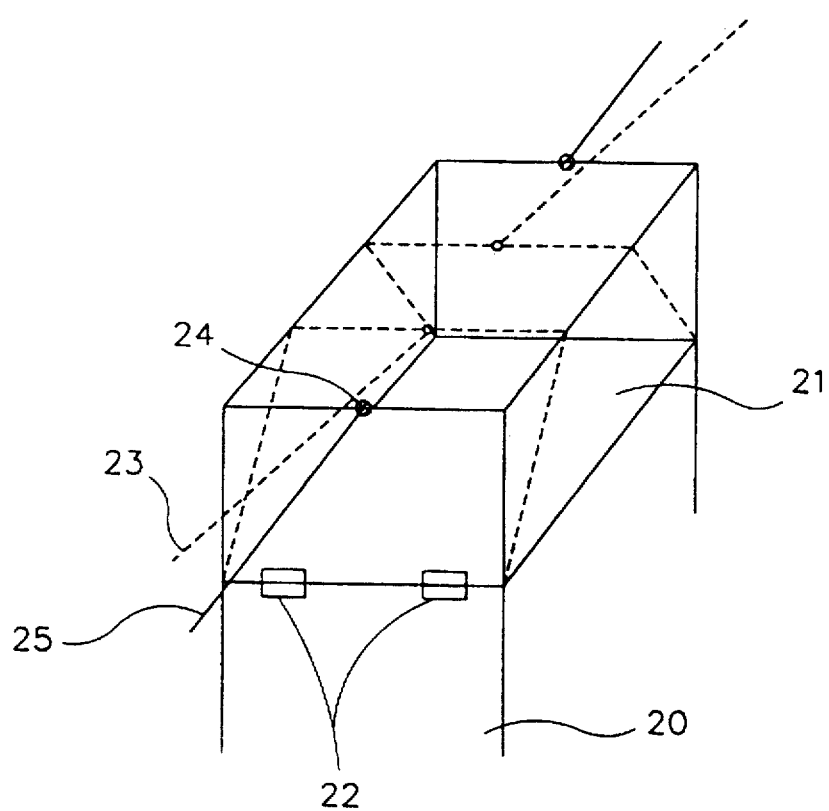
FIG. 5 is a perspective view illustrating a semiconductor wafer cleansing apparatus according to another embodiment of the present invention.

FIG. 5 is a perspective view illustrating a semiconductor wafer cleansing apparatus according to another embodiment of the present invention.

As shown therein, fixed walls 21 are arranged at an upper portion of the lower inner tub 20, and a tiltable wall 23 is arranged between the fixed walls 21 in cooperation with a first hinge member 12. A robot arm 25 is disposed in the upper portion of the tiltable wall 23 and is movable in cooperation with a second hinge member 24. Namely, with the above-described elements, it is possible to inwardly folding the tiltable wall 23 by using the robot arm 25, for thus reducing the cleansing space, whereby it is possible to reduce the amount of the cleansing liquid.

As described above, the apparatus for cleansing semiconductor wafer according to the present invention is directed to separating an inner tub into an upper and lower portion, for thus adjustably forming the inner tub, so that it is possible to fold the upper portion of the inner tub when cleansing the wafer, for thus reducing the cleansing space, whereby it is possible to reduce the amount of the cleansing liquid and increasing the cleansing effect.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An apparatus for cleansing a semiconductor wafer, comprising:
    an outer tub having a supply tube for supplying a cleansing liquid and for discharging the cleansing liquid;
    a lower inner tub disposed inside the outer tub;
    an upper lower tub disposed above the lower inner tub, which upper lower tub is adjustable in cooperation with a first hinge member;
    a driving means disposed in cooperation with a second member for opening and closing the upper inner tub;
    a control means for controlling the driving means;
    a baffle plate for distributing the cleansing liquid supplied through a supply tube; and
    a pump disposed in the supply tube for supplying the cleansing liquid into the inner tub.

2. The apparatus of claim 1, wherein an inner circumferential surface of the upper inner tub and a wafer is spaced apart by more than 1 mm during a cleansing process.

3. The apparatus of claim 1, wherein said upper inner tub has four walls, with each wall being formed to be a parallelogram.

4. The apparatus of claim 2, wherein said upper inner tub has four walls, with each wall being formed to be a parallelogram.

* * * * *